(12) United States Patent  
Campbell et al.

(10) Patent No.: US 8,168,467 B2
(45) Date of Patent: May 1, 2012

(54) SOLAR CELL METHOD OF FABRICATION VIA FLOAT GLASS PROCESS

(76) Inventors: James P Campbell, Menlo Park, CA (US); Harry R Campbell, Los Gatos, CA (US); Ann B Campbell, Los Gatos, CA (US); Joel F Farber, San Jose, CA (US)

( * ) Notice: Subject to any disclaimer, the term of this patent is extended or adjusted under 35 U.S.C. 154(b) by 171 days.

(21) Appl. No.: 12/725,934

(22) Filed: Mar. 17, 2010

(65) Prior Publication Data

US 2011/0226316 A1 Sep. 22, 2011

(51) Int. Cl.
*H01L 21/00* (2006.01)

(52) U.S. Cl. ........... 438/94; 438/57; 438/87; 438/476; 438/496; 438/920; 257/E27.125; 257/E31.126

(58) Field of Classification Search .......... 438/57, 438/87, 94, 95, 476, 796, 920; 257/E27.125, 257/E31.126
See application file for complete search history.

(56) References Cited

U.S. PATENT DOCUMENTS

| | | |
|---|---|---|
| 4,824,489 A | 4/1989 | Cogan et al. |
| 5,192,991 A | 3/1993 | Hosokawa |
| 5,413,959 A | 5/1995 | Yamamoto et al. |
| 5,667,597 A | 9/1997 | Ishihara |
| 5,677,240 A | 10/1997 | Murakami et al. |
| 5,714,404 A | 2/1998 | Mitlitsky et al. |
| 6,111,191 A | 8/2000 | Hall et al. |
| 6,180,871 B1 | 1/2001 | Campbell et al. |
| 6,211,455 B1 | 4/2001 | Ford et al. |
| 6,320,117 B1 | 11/2001 | Campbell et al. |
| 6,420,643 B2 | 7/2002 | Ford et al. |
| 6,509,204 B2 | 1/2003 | Campbell |
| 7,091,411 B2 | 8/2006 | Falk et al. |
| 7,498,058 B2 | 3/2009 | Harris et al. |
| 7,592,198 B2 | 9/2009 | Huet et al. |
| 2009/0162966 A1 | 6/2009 | Jawarani et al. |
| 2010/0255627 A1* | 10/2010 | Cording et al. ............ 438/62 |

OTHER PUBLICATIONS

Besore, Paul A. "Large-Area Deposition for Crystalline Silicon on Glass Modules" Presentation at 3rd World Conference on Photovoltaic Energy Conversation, Osaka, May 2003.

* cited by examiner

*Primary Examiner* — Jarrett Stark
*Assistant Examiner* — John M Parker

(57) ABSTRACT

The present invention provides improved solar cells. This patent teaches a particularly efficient method of device manufacture based on incorporating the solar cell fabrication into the widely used, high temperature, Float Glass manufacture process.

9 Claims, 3 Drawing Sheets

SOLAR CELL METHOD OF FABRICATION VIA FLOAT GLASS PROCESS

BACKGROUND OF THE INVENTION

The present invention relates, in general, to electronic devices. More particularly, the present invention provides an improved solar cell formed with a P-N junction diode or N-P junction diode and method of its manufacture.

Solar energy provides many advantages over traditional energy sources. Many different applications benefit greatly from the use of solar energy. For example, buildings and automobiles with their broad surfaces that are exposed to the sun's energy for much of the day can use that energy to provide some or all of their energy needs. Various solar cells have been developed using different fabrication techniques to take advantage of this energy source, most are expensive.

The inventors of the present invention have previously filed patent applications directed toward solar cells. Those patent applications describe a transparent or semi-transparent structure that includes a P-N junction diode. This patent teaches a particularly efficient method of device manufacture based on incorporating the solar cell fabrication into the widely used, high temperature, Float Glass manufacture process, not restricted to transparent components, so it is more cost effective and efficient.

BACKGROUND ON THE FLOAT GLASS PROCESS

The flat glass industry and its primary products are classified under Standard Industrial Classification (SIC) 3211. Among the products included are flat building glass, cathedral glass, float glass, antique glass, sealed insulating glass units, laminated glass made from glass produced in the same establishments, picture glass, plate glass (rough or polished), skylight glass, flat structural glass, tempered glass, window glass, etc.

There are three basic types of flat glass; sheet, plate, and float. The principal distinction between these types of glass is how they are made, since the manufacturing processes used in producing them are very different.

In the Float Glass process, glass is melted in very large side port furnaces, and the exiting molten glass is "poured" onto a pool of molten tin. A continuous ribbon of glass is then drawn from this spreading mass. This process has the advantage of pushing the refractory contaminated glass to the outside of the ribbon; it is later scrapped. The process has now been developed to provide any thickness glass from less than 1 to about 20 millimeters.

This continuous flow process may be augmented to produce the devices described in this patent, while the glass is still hot.

PRIOR ART

The prior art includes other types of solar cells with P-N junctions. One type of solar cell is formed with crystalline silicon. For these solar cells, crystalline silicon is formed by melting silicon and drawing an ingot of crystalline silicon of the size desired. Alternatively, a ribbon of crystalline silicon can be pulled from molten silicon to form a crystalline silicon solar cell. A conductor is placed on either side of the crystalline silicon to form the solar cell. These processes use high temperatures and the solar cells are expensive to manufacture. Packaging is also difficult and expensive. Their maximum size is limited by the manufacturing process. It is difficult to slice the resulting crystalline silicon thin enough to provide a transparent or flexible solar cell. However, these structures are very efficient (relative to other types of presently available commercial solar cells). As such, crystalline solar cells are used primarily for applications where efficiency is more important than cost and where the structures do not need to be flexible. For example, these are commonly used on satellites.

Another type of solar cell is formed with polycrystalline silicon. These may be formed as thin layers on wafers and can thus be made thinner than crystalline silicon solar cells. As is well known in the art, polycrystalline silicon can be formed by heating amorphous silicon and allowing it to cool. Typically, amorphous silicon begins to crystallize after it melts at temperatures greater than about 1400° C. and begins to cool below that level. Because of these high temperatures, known processes can only easily use substrates with high melting points. These processes are not appropriate for substrates made of plastics or other materials that melt at lower temperatures. In the manufacture of flat panel displays, it is known to use lasers to form polycrystalline silicon thin film transistors (TFTs). Such use has not included the formation of P-N junctions or solar cells which presents its own set of challenges. The entire surface is covered with amorphous silicon which is subsequently crystallized, then etched into individual transistors. Moreover, these manufacturing processes generally formed single transistors and were not used to form large sheets or areas of polycrystalline silicon, the solar cells.

Another type of solar cell has been formed using doped layers of amorphous silicon. These are not subject to some of the problems inherent in the previously described crystalline silicon or polycrystalline solar cells. First, amorphous silicon can be formed using low temperature processes. Thus, it can be formed on plastic and other flexible substrates. They can also be formed over large surfaces. Second, the processing techniques are less expensive. Nevertheless, amorphous solar cells introduce other significant limitations not found in crystalline silicon or polycrystalline silicon solar cells. For example, hydrogen is generally added during the manufacturing to increase the efficiency of the cell. Amorphous silicon solar cells tend however to lose this hydrogen over time, causing reduced efficiency and reduced usable life. Thus, they are not appropriate for some applications.

The device and method of U.S. Pat. No. 6,624,009 teaches a method of crystallizing amorphous silicon on a glass substrate, however there is no initial conductive substrate deposited, and it is not imbedded in the float glass manufacturing process. It is a batch process not a continuous process.

The device and method of manufacture presented here characterize a novel approach very different than the prior art.

SUMMARY OF THE INVENTION

The present invention provides for improved devices such as non-transparent solar cells. It also provides significantly improved methods for forming those devices. The objective of this invention is to produce solar cells for use on buildings and stand alone applications. In contrast with devices and methods previously disclosed by one of the present inventors, these improved devices and methods use much less expensive fabrication processes and results in simpler devices along with other beneficial results. Moreover, compared with other fabrication techniques, the present invention allows for the fabrication of devices using existing fabrication equipment and processing steps, while allowing those processes to be done quickly and in a less costly manner.

Thus, a new solar cell and method of fabrication that will avoid these problems and is more efficient to manufacture is desirable. Incorporating the solar device fabrication into the Float Glass process, while the glass is in a hot and in a 'plastic state', prevents damage to the substrate and reduces problems that would otherwise be encountered maintaining a flat substrate surface. Another desirable characteristic of the float glass process is that it provides a slow moving continuous flow substrate for device fabrication. Fabricating while the glass is already hot also further reduces the total energy required to produce a solar cell and thus reduces its cost.

In an embodiment of the present invention, a method is provided for fabricating a non-transparent device. The method may be incorporated in the existing and well known Float Glass process. The method comprises forming a first conductive layer overlying a glass substrate, forming a first dopant-silicon layer overlying the first conductive layer; then forming a second dopant-silicon layer (of opposite dopant type) overlying the first dopant-silicon layer; and converting the silicon layers into polycrystalline silicon by application of thermal energy. Xenon flash lamps or similar devices may be used for applying the thermal energy. Each dopant type and silicon may be premixed and applied together as a single step. Following these process steps a final conductive layer is applied, and the layers may then be patterned.

The methodology produces a P-N or N-P diode junction between the conductive layers. The resulting device may be used as a solar cell. Additional coatings may be applied to engineer the light transmission to fit the application requirements. A further understanding of the nature and advantages of the inventions presented herein may be realized by reference to the remaining portions of the specification and the attached drawings.

DESCRIPTION OF THE SPECIFIC EMBODIMENTS

Method of Manufacture

Figure 1:
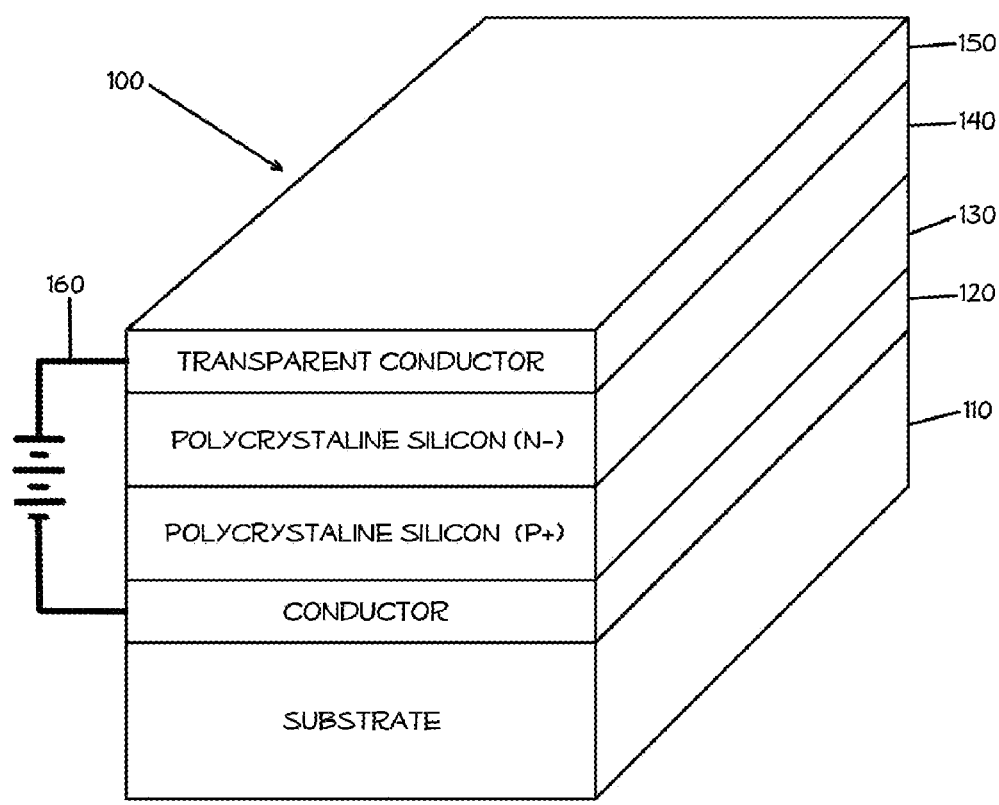
FIG. 1 is a cross-sectional diagram of a non-transparent solar cell according to the present invention.

FIG. 1 is a cross-sectional diagram of an embodiment of solar cell 100 according to the present invention, referred to generically herein as a solar cell.

Solar cell 100 has a substrate layer 110 providing a base structure for the device. Substrate layer 110 may be glass, which is treated during the Float Glass process while the glass is still hot. A first conductive layer 120 overlies the substrate 110. A P-N junction overlies the first conductive layer 120. The P-N junction is formed by a p+ doped polycrystalline silicon layer 130 and an n− doped polycrystalline silicon layer 140. In other embodiments (not shown), the order is reversed and p+ polycrystalline silicon layer 130 is formed above n− polycrystalline layer 140. A second conductive layer 150 resides above the P-N junction. 160 depicts external electrical connection.

Solar cell 100 can be used in applications where common float glass is not usually used. For example, it can be used as siding or roofing, or on non-transparent portions on buildings, or applied to the flat opaque surfaces of automobiles. Such a device can absorb some of the photons from sunlight or other light sources to produce electricity. While this is a list of some of its applications, it is of course not exhaustive.

While a specific embodiment has been described herein, it will be recognized that the present invention is not limited to the specific embodiment described. For example, the p+ and n− layers 130 and 140 may be reversed. Also, different or new fabrication techniques may be used or other changes made that do not depart from the spirit and scope of the present invention. The invention is intended to be limited only by the attached claims.

Figure 2:
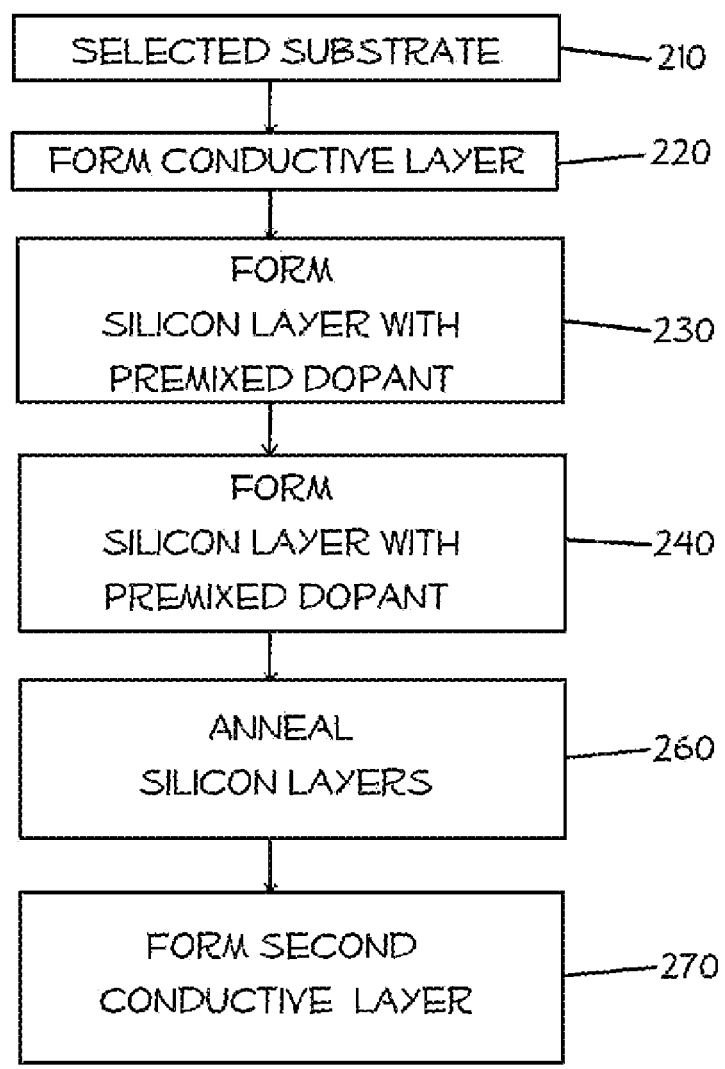
FIG. 2 is a flow diagram showing a method of fabricating solar cells according to the present invention.

FIG. 2 shows a flow diagram of a method of fabricating solar cell 100 according to the present invention. While FIG. 2 shows a specific embodiment, it is not intended that this be the only way such a solar cell may be fabricated. One of skill in the art will recognize that other variations of the invention are readily apparent from the specific embodiment described herein.

Referring to the flow diagram of FIG. 2, in step 210 a suitable substrate 110 is provided upon which solar cell 100 may be fabricated. In this embodiment the substrate is float glass. Significantly, glass during the float glass manufacturing process allows the heat required to crystallize amorphous silicon to be applied without damaging the glass substrate, due to the molten or plastic state of the glass. One of skill in the art will recognize many acceptable materials, such as steel, which can be heated to temperatures about 600 to 800 degrees centigrade or more for substrate 110 and any may be used without departing from the present invention. Depending upon the embodiment, substrate 110 may also be coated with a variety of materials.

In step 220, a first conductive layer 120 is formed on substrate 110. In the specific embodiment, conductive layer 120 is copper (Cu) deposited by sputtering vacuum deposition (SVD) over the entire substrate 110. Other materials for conductive layer 120 may include molybdenum, tungsten, etc. The specific embodiment has a copper layer over the area of interest 110; however, the thickness will vary for different applications and materials. Its thickness is a function of the desired amount of conductivity. Depending on the method of deposition an annealing step may be required. Conductive layer 120 may also be deposited or formed in other ways besides SVD. First conductive layer 120 may be a single layer or multiple layers, depending upon the embodiment.

In step 230, a first doped amorphous silicon layer 130 is formed by chemical vapor deposition (CVD) or other deposition method overlying the region of interest with the exception of about 2 to 3 cm strips at either one or both edges of conductive layer 120. In the specific embodiment, amorphous silicon layer 130 is a p-type material. It is doped by pre-mixing amorphous silicon with boron or other p-type dopant prior to forming the layer. The concentration of boron or other p-type dopant is such that is commonly used for producing solar cells. First amorphous silicon layer 130 preferably has a thickness of about 10 to 50 microns in the specific embodiment.

In step 240, a second doped amorphous silicon layer 140 is formed by chemical vapor deposition (CVD) or other deposition method overlying the region of interest with the exception of 2 to 3 cm strips at either one or both edges. In the specific embodiment, amorphous silicon layer 140 is an n-type material. It is doped by pre-mixing amorphous silicon with an n-type dopant material such as phosphorus or other n-type dopant prior to forming the layer. The concentration of phosphorus or other n-type dopant is such that is commonly used for producing solar cells. Second amorphous silicon layer 140 preferably has a thickness of about up to 10 microns in the specific embodiment.

In step 260, amorphous silicon layer 140 and amorphous silicon layer 130 are annealed using rapid thermal annealing (xenon flash lamps or other adequate heat source). This results in a polycrystalline structure, composed of 130 and 140 creating a P-N junction.

In step 270, a second conductive layer 150 is formed above the P-N junction resulting in solar device 100 as shown in FIG. 1. In the specific embodiment, the second conductive layer is transparent tin oxide or ITO or other suitable conductor. Conductive layer 150 is deposited with sputtering, CVD, or other method of deposition at a thickness of about up to 50 microns. Its maximum thickness is dependent upon the materials used and desired conductivity.

An advantage of solar cell 100 is that it does not depend on hydrogen as a carrier, so it does not suffer from the efficiency loss that amorphous silicon does. Thus, its lifetime is extended over that of amorphous solar cells and its efficiency is superior.

Figure 3:
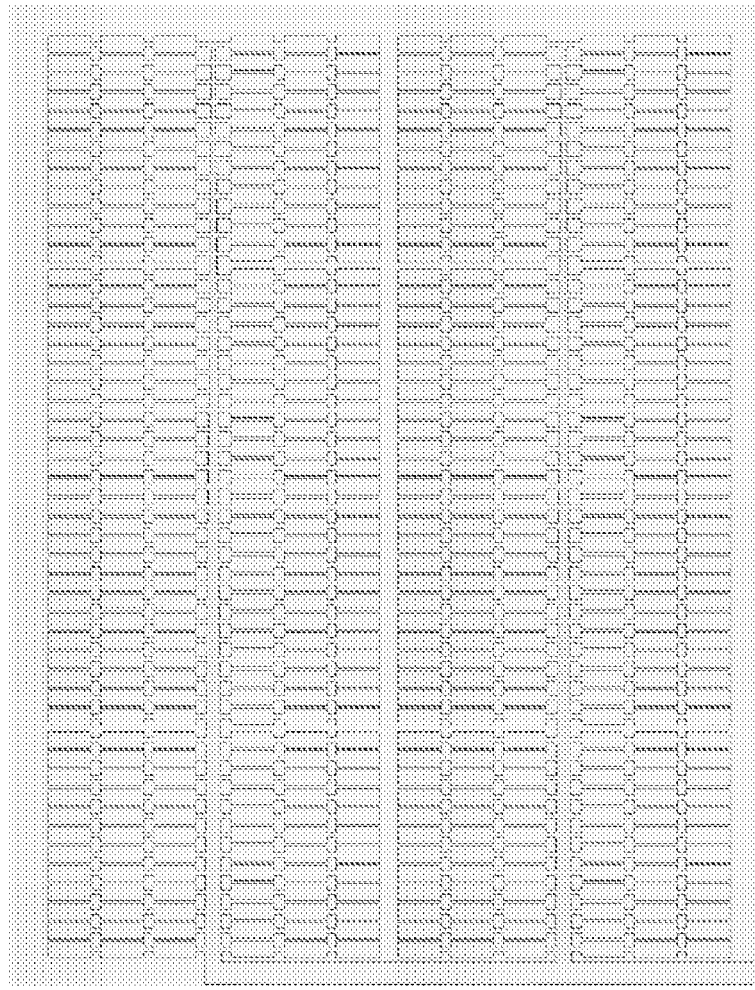
FIG. 3 is an example of an optional patterning of the solar cell.

FIG. 3 shows an example of patterning which may optionally be applied to any or all layers above the substrate of solar cell 100 by means of photo lithography or other methods dividing the area of solar cell 100 into multiple smaller cells with about 25 to 100 microns between the cells. FIG. 3 includes sample serial and parallel circuitry of the cells and the flow of the electrons to the bottom right corner of solar cell 100.

All numbers expressing dimensions, physical characteristics, quantities of ingredients, reaction conditions, and the like used in the specification and claims are to be understood as being modified in all instances by the term "about".

The invention claimed is:

1. A method of fabricating a solar cell device that incorporates the fabrication of said solar cell into a Float Glass manufacturing process comprising:
   a) forming a first conductive layer overlying a substrate of hot glass, during a Float Glass process;
   b) a first layer of silicon which has been pre-mixed with a suitable first type dopant material is then deposited at a thickness of about 10 to 50 microns;
   c) a second layer of silicon which has been pre-mixed with a suitable second type dopant material is then deposited at a thickness about up to 10 microns;
   d) the first dopant-silicon layer and the second dopant-silicon layer are then annealed by applying sufficient additional heat to melt the dopant-silicon layers causing subsequent crystallization of the silicon, forming a non-transparent polycrystalline structure;
   e) then a second layer of conductive material is applied overlying the polycrystalline structure;
   f) then any or all layers on the glass substrate are patterned by means of photo lithography, or other means, thus describing serial and parallel circuitry of the cells.

2. The method of claim 1 wherein the first dopant type is p and the second dopant type is n, forming a polycrystalline P-N junction after annealing.

3. The method of claim 1 wherein the first dopant type is n and the second dopant type is p, forming a polycrystalline N-P junction after annealing.

4. A method of fabricating a solar cell device that incorporates the fabrication of said solar cell into a Float Glass manufacturing process comprising:
   a) forming a first conductive layer overlying a substrate of hot glass, during a Float Glass process;
   b) a first layer of silicon which has been pre-mixed with a suitable first type dopant material is then deposited at a thickness of about 10 microns;
   c) a second layer of un-doped silicon is then deposited at a thickness of about 10 to 50 microns;
   d) a third layer of silicon which has been pre-mixed with a suitable second type dopant material is then deposited at a thickness of about 10 microns;
   e) the first, second and third layers of silicon are then annealed by applying sufficient additional heat to melt the silicon layers causing subsequent crystallization of the silicon, forming a non-transparent polycrystalline structure;
   f) then a second layer of conductive material is applied overlying the polycrystalline structure;
   h) then any or all layers on the glass substrate are patterned by means of photo lithography, or other means, thus describing serial and parallel circuitry of the cells.

5. The method of claim 4 wherein the first dopant type is p and the second dopant type is n, forming a polycrystalline P-N junction after annealing.

6. The method of claim 4 wherein the first dopant type is n and the second dopant type is p, forming a polycrystalline N-P junction after annealing.

7. A method of fabricating a solar cell device that incorporates the fabrication of said solar cell into a Float Glass manufacturing process comprising:
   a) forming a first conductive layer overlying a substrate of hot glass, during a Float Glass process;
   b) a layer of a suitable first type dopant material is then deposited;
   c) a layer of un-doped silicon is then deposited at a thickness of about 20 to 50 microns;
   d) a layer of a suitable second type dopant material is then deposited;
   e) the layer of first type dopant material, the layer of silicon and the layer of second type dopant material are then annealed by applying sufficient additional heat to melt the silicon layer causing subsequent crystallization of the silicon, forming a non-transparent polycrystalline structure;
   f) then a second layer of conductive material is applied overlying the polycrystalline structure;
   g) then any or all layers on the glass substrate are patterned by means of photo lithography, or other means, thus describing serial and parallel circuitry of the cells.

8. The method of claim 7 wherein the first dopant type is p and the second dopant type is n, forming a polycrystalline P-N junction after annealing.

9. The method of claim 7 wherein the first dopant type is n and the second dopant type is p, forming a polycrystalline N-P junction after annealing.

* * * * *